(12) United States Patent
Wang et al.

(10) Patent No.: US 7,663,202 B2
(45) Date of Patent: Feb. 16, 2010

(54) NANOWIRE PHOTODIODES AND METHODS OF MAKING NANOWIRE PHOTODIODES

(75) Inventors: Shih-Yuan Wang, Palo Alto, CA (US); Michael Renne Ty Tan, Menlo Park, CA (US); Alexandre M. Bratkovski, Mountain View, CA (US); R. Stanley Williams, Redwood City, CA (US); Nobuhiko Kobayashi, Sunnyvale, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 185 days.

(21) Appl. No.: 11/819,226

(22) Filed: Jun. 26, 2007

(65) Prior Publication Data

US 2009/0001498 A1 Jan. 1, 2009

(51) Int. Cl.
*H01L 31/058* (2006.01)

(52) U.S. Cl. ............... 257/461; 257/233; 257/E31.058; 438/31; 438/48; 977/765

(58) Field of Classification Search ................. 257/461, 257/233, E31.058; 438/31, 48; 977/765
See application file for complete search history.

(56) References Cited

U.S. PATENT DOCUMENTS

| 7,129,554 B2 * | 10/2006 | Lieber et al. ................ 257/414 |
| 7,211,464 B2 | 5/2007 | Lieber et al. |
| 7,214,303 B2 | 5/2007 | Naughton |
| 2002/0014667 A1 | 2/2002 | Shin et al. |
| 2004/0211271 A1 | 10/2004 | Han et al. |
| 2006/0097389 A1 | 5/2006 | Islam et al. |
| 2006/0098705 A1 | 5/2006 | Wang et al. |

FOREIGN PATENT DOCUMENTS

| KR | 10-20020095800 | 12/2002 |
| KR | 10-20040092355 | 11/2004 |

OTHER PUBLICATIONS

PCT International Search Report for Application No. PCT/US2008/007931 (Jun. 25, 2008), ISR issued Jun. 23, 2009.
B.J. Ohlsson, M.T. Björk, M.H. Magnusson, K. Deppert, L. Samuelson and L.R. Wallenberg, "Size-, shape-, and position-controlled GaAs nano-whiskers," *Applied Physics Letters*, vol. 79, No. 20, pp. 3335-3337 (Nov. 11, 2001).
M.H. Huang, S. Mao, H. Feick, H. Yan, Y. Wu, H. Kind, E. Weber, R. Russo and P. Yang, "Room-Temperature Ultraviolet Nanowire Nanolasers," *Science*, vol. 292, pp. 1897-1899 (Jun. 8, 2001).
S.S. Yi, G. Girolami, J. Adamo, M. S. Islam, S. Sharma, T.I. Kamins and I. Kimukim, "InP nanobridges epitaxially formed between two vertical Si surfaces by metal-catalyzed chemical vapor deposition," *Applied Physics Letters*, vol. 89, pp. 133121 (2006).

(Continued)

*Primary Examiner*—Thinh T Nguyen

(57) ABSTRACT

Nanowire-based photodiodes are disclosed. The photodiodes include a first optical waveguide having a tapered first end, a second optical waveguide having a tapered second end, and at least one nanowire comprising at least one semiconductor material connecting the first and second ends in a bridging configuration. Methods of making the photodiodes are also disclosed.

20 Claims, 3 Drawing Sheets

OTHER PUBLICATIONS

H. Yan, R. He, J. Johnson, M. Law, R. J. Saykally and P. Yang, "Dendritic Nanowire Ultraviolet Laser Array," *J. Am. Chem. Soc.*, vol. 125, No. 16, pp. 4728-4729 (2003).

T. Kamins, "Beyond CMOS Electronics: Self-Assembled Nanostructures," The Electrochemical Society *Interface*, pp. 46-49, Spring 2005.

M. S. Islam, S. Sharma, T.I. Kamins and R. S. Williams, "Ultrahigh-Density Silicon Nanobridges Formed Between Two Vertical Silicon Surfaces," *Nanotechnology* 15, L5-L8 (2004).

M.T. Bjork, B.J. Ohlsson, T. Sass, A.I. Persson, C. Thelander, M.H. Magnusson, K. Deppert, L. R. Wallenberg and L. Samuelson, "One-dimensional Steeplechase for Electrons Realized," *Nano Letters*, vol. 2, No. 2, pp. 87-89 (2002).

J. S. Lee, M. S. Islam and S. Kim, "Photoresponses of ZnO nanobridge devices fabricated using a single-step thermal evaporation method," *Sens. Actuators B: Chem* (2006), doi:10.1016/j.snb.2006.10.042.

A. B. Greytak, C. J. Barrelet, Y. Li and C. M. Lieber, "Semiconductor nanowire laser and nanowire waveguide electro-optic modulators," *Applied Physics Letters*, vol. 87, 151103, (2005).

R. Agarwal and C.M. Lieber, "Semiconductor nanowires: optics and optoelectronics," *Applied Physics A*, vol. 85, pp. 209-215 (2006).

Jr H. He, S. T. Ho, T. B. Wu, L. J. Chen and Z. L. Wang, "Electrical and photoelectrical performances of nano-photodiode based on ZnO nanowires," *Chemical Physics Letters*, vol. 435, pp. 119-122 (2007).

O. Hayden, R. Agarwal and C. M. Lieber, "Nanoscale avalanche photodiodes for highly sensitive and spatiallly resolved photon detection," *Nature Materials*, vol. 5, pp. 352-356 (May 2006).

L. Luo, Y. Zhang, S. S. Mao and L. Lin, "Fabrication and characterization of ZnO nanowires based UV photodiodes," *Sensors and Actuators A*, vol. 127, pp. 201-206 (2006).

\* cited by examiner

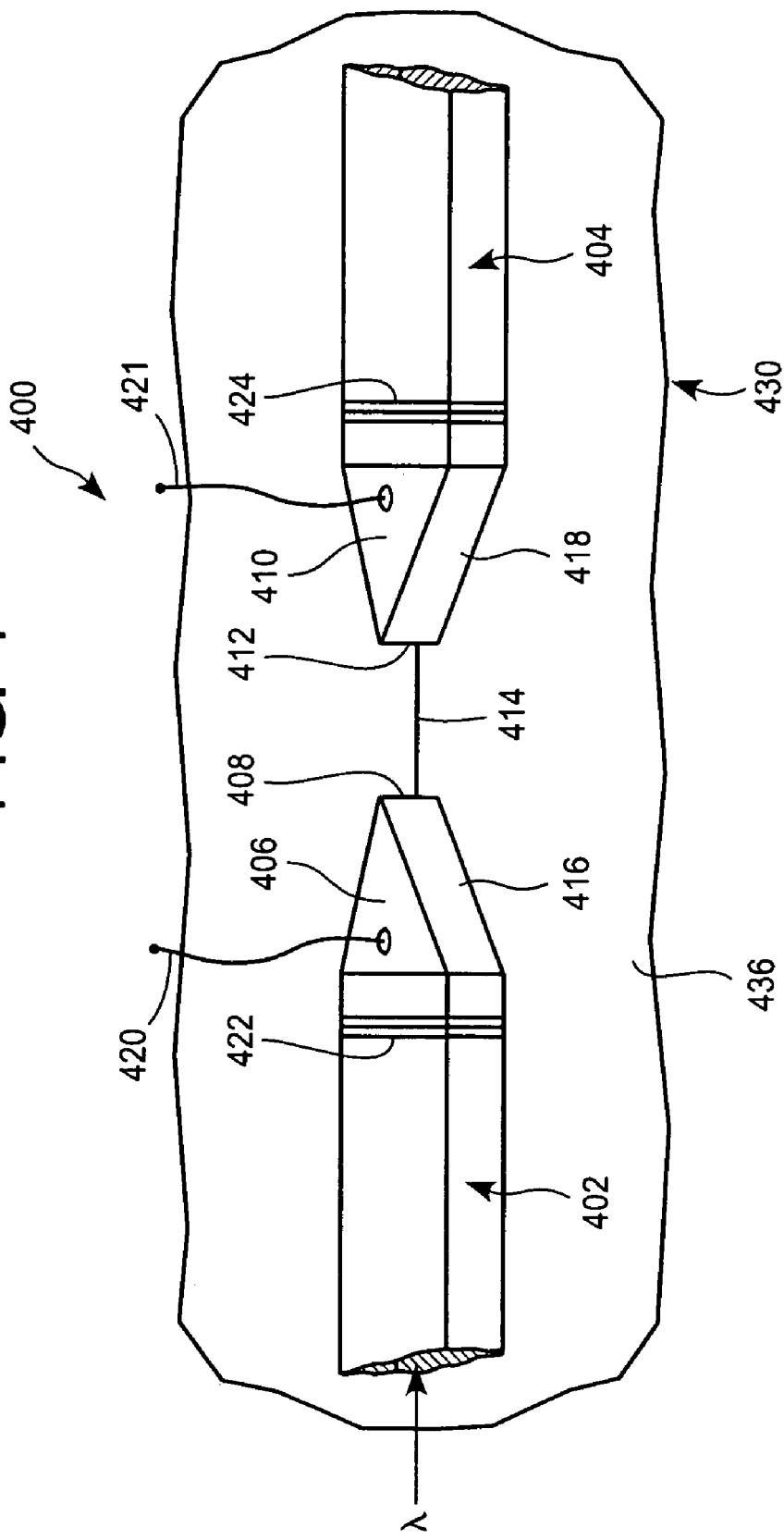

NANOWIRE PHOTODIODES AND METHODS OF MAKING NANOWIRE PHOTODIODES

BACKGROUND

Nanotechnology and quantum information technology involve the design of extremely small electronic and optical circuits. It would be desirable to provide nanometer-scaled, opto-electronic devices including nanowires that are suitable for nanotechnology and quantum information technology applications, where such devices offer efficient performance and can be fabricated by low-cost fabrication techniques in a manufacturing environment.

SUMMARY

An exemplary embodiment of a nanowire photodiode comprises a first optical waveguide comprising a tapered first end including a first tip; a second optical waveguide comprising a tapered second end including a second tip spaced from the first tip; and at least one nanowire comprising at least one semiconductor material, the nanowire connecting the first tip and the second tip in a bridging configuration.

Another exemplary embodiment of a nanowire photodiode comprises a substrate having a surface; a first optical waveguide fabricated integrally on or in the surface of the substrate, the first optical waveguide comprising a tapered first end including a first tip; a second optical waveguide fabricated integrally on or in the surface of the substrate, the second optical waveguide comprising a tapered second end including a second tip spaced from the first tip; wherein the first and second optical waveguides comprise the same material as the surface of the substrate; and at least one nanowire comprising at least one first semiconductor material, the nanowire connecting the first tip and the second tip in a bridging configuration.

An exemplary embodiment of a method of fabricating a nanowire photodiode comprises growing at least one nanowire comprising at least one first semiconductor material from a first tip of a tapered first end of a first optical waveguide such that the nanowire connects in a bridging configuration to a second tip of a tapered second end of a second optical waveguide spaced from the first tip.

DRAWINGS

FIG. 4 illustrates another exemplary embodiment of a nanowire photodiode fabricated integrally on a substrate.

DETAILED DESCRIPTION

Photodiodes are used to convert optical signals to electrical signals. Nano-scale photodiodes are desirable for integrating other nanophotonic elements, such as nano-scale light emitting diodes and lasers, with nanoelectronics. Nanowires can be used to carry electrical and optical signals and to detect and emit light. For light detection applications, however, the very small diameter of nanowires corresponds to a very small photon absorption cross-section, which presents challenges in regard to achieving satisfactory device sensitivity. Multiple nanowires can be used to improve sensitivity, but this approach sacrifices device capacitance. A single nanowire, or only a few nanowires, are desirable for ultralow capacitance photodiodes.

Nanowire photodiodes are disclosed that are constructed to operate with desirable photon detection sensitivity and capacitance. Embodiments of the photodiodes can be used to detect light without having to also use components for amplifying the electrical signal outputted by the photodiodes to compensate for the small photon absorption cross-section of the nanowire(s) of the photodiodes.

Figure 1:
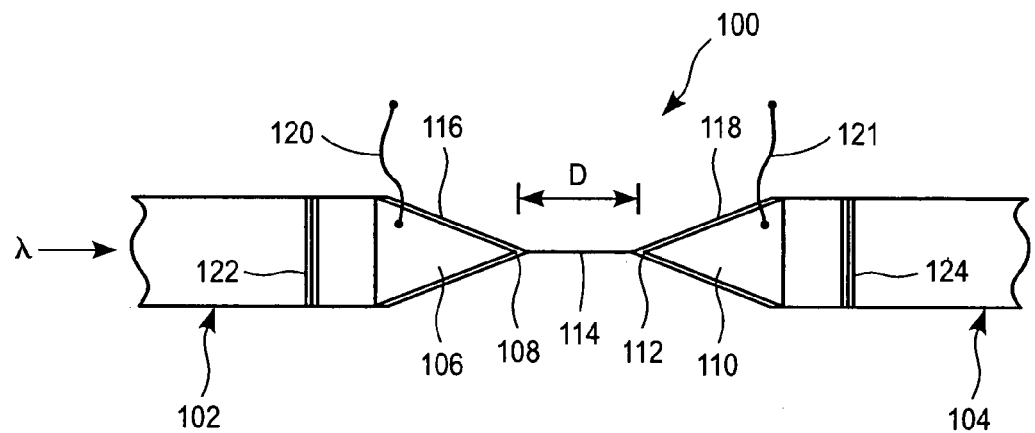
FIG. 1 illustrates an exemplary embodiment of a nanowire photodiode.

A nanowire photodiode 100 according to an exemplary embodiment is shown in FIG. 1. The photodiode 100 comprises a first optical waveguide 102 and a second optical waveguide 104. Only a section of the first optical waveguide 102 and a second optical waveguide 104 are shown for simplicity. The first optical waveguide 102 includes a tapered first end 106 terminating in a first tip 108, and the second optical waveguide 104 includes a tapered second end 110 terminating in a second tip 112. The first tip 108 and second tip 112 are spaced from each other by a distance, D. A nanowire 114 connects the first tip 108 to the second tip 112 in a bridging configuration. The nanowire 114 acts as a detector and a waveguide in the photodiode 100.

The nanowire 114 can be grown from the first tip 108 or the second tip 112. For example, the nanowire 114 can be grown from the first tip 108 and extend continuously between the first tip 108 and second tip 112, and impinge on, and mechanically and electrically connect to, the second tip 112 to directly bridge the first optical waveguide 102 and second optical waveguide 104. The ends of the nanowire 114 form a self-assembled nanowire connection between the opposing first tip and second tip 112.

In the embodiment, the first end 106 and second end 110 are tapered and have respective cross-sectional areas that decrease continuously in the longitudinal direction to the first tip 108 and second tip 112, respectively. The taper of the first end 106 and second end 110 can be varied. The taper is preferably gradual, such as an angle of less than about 3°, such as less than about 2° or less than about 1°, to reduce reflections. In the photodiode 100, the tapered first end 106 and second end 110 provide a transition to the nanowire(s) 114.

The first optical waveguide 102 and the second optical waveguide 104 can be, for example, optical fibers having a circular cross-section along the body and having a tapered end. The optical fibers can be, for example, silica optical fibers, semiconductor fibers, such as silicon fibers, fibers with erbium doping for gain, and the like. The diameters of the optical fibers decrease in the longitudinal direction along the first end 106 to the first tip 108 and along the second end 110 to the second tip 112, respectively. In another embodiment, the first optical waveguide 102 and the second optical waveguide 104 have a non-circular cross-section, such as square, rectangular or the like, which decreases in size at the first end 106 in the direction to the first tip 108, and at the second end 110 in the direction to the second tip 112. In the embodiment, the first optical waveguide 102 and second optical waveguide 104 can typically have a cross-sectional diameter, or width, of about 5 µm to about 50 µm adjacent the tapered first end 106 and the tapered second end 110. The first optical waveguide 102 and second optical waveguide 104 can typically have approximately the same cross-sectional shape and dimensions.

The first optical waveguide 102 and second optical waveguide 104 can be tapered by any technique that produces the desired tapers and dimensions of the first end 106 and second end 110. In an exemplary embodiment, a cylindrical optical fiber can be heated in a suitable atmosphere and tensioned to separate the optical fiber into the first optical waveguide 102 and the second optical waveguide 104. The tensioning operation also tapers the first optical waveguide 102 and second optical waveguide 104 to form the tapered first end 106 and tapered second end 110, respectively.

In the embodiment, at least one layer 116 of p-type semiconductor material or n-type semiconductor material is coated on the first end 106 of the first optical waveguide 102, and at least one layer 118 of the other of p-type semiconductor material or n-type semiconductor material is coated on the second end 110 of the optical waveguide 104. The coating layers 116, 118 can be applied on the entire first end 106 and second end 110 as shown. Alternatively, the coating layers 116, 118 can be applied on only the sides of the first end 106 second end 110, or substantially on only the first tip 108 and second tip 112. The coating layers 116, 118 are formed on the first end 106 and second end 110 before fabricating the nanowire 114.

The coatings 116, 118 can comprise any material that has suitable physical characteristics to enable the growth of the nanowire 114 from the first tip 108 or second tip 112, and provide desirable electrical characteristics. The coating material can be single-crystal material, e.g., single crystal silicon, or non-single crystal material, such as polycrystalline silicon, amorphous silicon, microcrystalline silicon, sapphire, or carbon-based inorganic materials, such as diamond and diamond-like carbon. Each of the coating layers 116, 118 can be doped to a doping level effective to provide the desired electrical characteristics in the photodiode 100.

The coating layers 116, 118 can be epitaxially grown or amorphously deposited on the first optical waveguide 102 and second optical waveguide 104 by any suitable techniques. Exemplary techniques for applying the coatings include molecular beam epitaxy (MBE), metal-organic chemical vapor deposition (MOCVD), chemical vapor deposition (CVD) and plasma enhanced CVD (PECVD).

In another exemplary embodiment, at least a portion of the first end 106 of the first optical waveguide 102 can be doped with p-type semiconductor material or n-type semiconductor material, and at least a portion of the second end 110 of the second optical waveguide 104 can be doped with the other of p-type semiconductor material or n-type semiconductor material.

Light can be emitted into the first optical waveguide 102 or second optical waveguide 104 by a light source that emits light within the desired wavelength region. FIG. 1 depicts an optical signal, λ, emitted into the first optical waveguide 102. For example, the light can be within the range of about 0.6 µm to about 1.6 µm, such as in the range of about 0.75 µm to about 1.6 µm, e.g., at about 0.780 µm or about 1.55 µm depending on the application of the photodiode 100. Other exemplary embodiments of the photodiode described herein can also be operated at such wavelengths.

An exemplary light source can be built using group III-V compound semiconductor materials, such as GaN, AlGaAs, InGaAs, GaAlSb, InP, InGaAsP and the like. The light source can be an external light source coupled to the first optical waveguide 102 (or second optical waveguide 104). Alternatively, the light source can be a component of an integrated system including the photodiode 100, and optionally additional electronic and/or optoelectronic components.

The first optical waveguide 102 and second optical waveguide 104 can be electrically connected to a power source via electrical contacts and leads 120, 121, respectively. In an exemplary embodiment, the electrical contacts can be fabricated from transparent indium tin oxide (ITO), which contacts with the n-type and p-type portions of the first end 106 and second end 110 and connects to a high-speed electrical transmission line, such as a coplanar line, where the electrical signal propagates to appropriate signal processing integrated circuits. The power source is operable to produce reverse bias.

In the photodiode 100, the problem of coupling optical energy of the optical signal carried by the first optical waveguide 102 or second optical waveguide 104 into the small cross-sectional area of the nanowire 114 is addressed by tapering the first optical waveguide 102 and second optical waveguide 104 such that the optical field of the optical signal carried by the first optical waveguide 102 or second optical waveguide 104 is forced onto the nanowire 114. By tapering the first end 106 and second end 110 of the first optical waveguide 102 and second optical waveguide 104, respectively, to couple to the opposite ends of the nanowire 114, the peak intensity of the optical field can be concentrated on the nanowire 114 to thereby increase the light conversion efficiency of the photodiode 100. In addition, light propagating along the length of the nanowire 114 is attenuated due to the absorption of the light by the nanowire. Because the energy of the light is above the bandgap of the nanowire 114, electron hole pairs are generated. The carriers are swept out by applying a reverse bias, generating an electrical current in external circuitry. For operations in the range of tens of GHz, the nanowire length is typically about 1 µm to about 5 µm. The speed of the photodiode 100 is limited mostly by transport of the carriers being swept out (i.e., the sweep-out time) of the nanowire 114 by the reverse bias.

In another exemplary embodiment, the nanowire 114 can be formed with tapered end portions adjacent an intermediate portion. Other exemplary embodiments of photodiodes described herein can include one or more nanowires including such tapered and intermediate portions.

As shown in FIG. 1, the photodiode 100 can optionally include a first Bragg reflector 122 in the first optical waveguide 102 and a second Bragg reflector 124 in the second optical waveguide 104. The first Bragg reflector 122, nanowire 114 and second Bragg reflector 124 form an optical cavity. The first Bragg reflector 122 and second Bragg reflector 124 reflect photons that are not absorbed by the nanowire 114 during the first pass of the photons through the nanowire 114, to thereby increase the light conversion efficiency of the photodiode 100.

Embodiments of the photodiodes described herein can operate with very low capacitance. The capacitance of the nanowire 114 can be represented by the equation: $C = \in \cdot A/d$ to a first order; where $\in$ is the dielectric permittivity of the nanowire 114, A is the cross-sectional area of the nanowire 114, and d is the length of the nanowire 114 (which is typically approximately equal to D). The capacitance, C, of the photodiode 100 is reduced by reducing A and/or increasing d. The first tip 108 of the first optical waveguide 102 and the second tip 112 of the second optical waveguide 104 are preferably tapered to about the same cross-sectional area as that of the nanowire 114 to enhance the light coupling efficiency of the photodiode 100.

In exemplary embodiments, the nanowire 114 can have a diameter of about 10 nm to about 500 nm, such as about 10 nm, 20 nm, 50 nm, 100 nm, 200 nm, or 500 nm, and a length of about 0.5 µm to about 5 µm, such as about 0.5 µm, 1 µm, 2 µm, 3 µm, 4 µm or 5 µm. The nanowires provided in other exemplary embodiments of the photodiodes described herein can also have such dimensions. As described above, the diameter (cross-section) and length of the nanowire 114 can each be varied substantially to substantially decrease the capacitance of the photodiode 100. Preferably, embodiments of the photodiode 100 can have a capacitance of less than about 1 femtofarad [fF] ($1\times10^{-15}$ F), such as less than about 0.5 fF, about 0.1 fF, or about 0.01 fF (i.e., 10 attofarads [aF]). The capacitance of the photodiode 100 is mainly from fringing capacitance. Tapering of the first optical waveguide 102 and second optical waveguide 104 substantially reduces the fringing capacitance of the photodiode 100.

The low capacitance of the photodiode 100 allows it to output a large voltage. That is, the capacitance, C, can also be defined as the constant of proportionality in the equation: Q=CV, where Q is the charge on a "plate" of the capacitor, and V is the voltage difference between the "plates" of the capacitor. Accordingly, decreasing the capacitance, C, increases the voltage, V. The large output voltage of the photodiode 100 allows it to detect low light levels without the need to include additional components to post-amplify the electrical signal. The photodiode 100 allows the use of simplified circuitry and reduces power consumption.

Embodiments of the photodiode 100 can provide a desirably high external quantum efficiency (EQE), which is a measure of how effectively the photodiode can convert light to electricity. The EQE can be defined as the ratio of the number of electrons generated per unit time by the photodiode to the number of incoming photons per unit time. Embodiments of the photodiode 100 are expected to provide an EQE of at least about 10%, such as at least about 20%, 30%, 40%, 50%, 60%, 70%, 80% or 90%. For embodiments of the photodiode 100 that include a single nanowire 114, an EQE of at least 10% is expected. Other exemplary embodiments of the photodiode 100 can include more than one nanowire 114, such as two, five, ten or more nanowires 114, depending on the desired capacitance of the device. For embodiments of the photodiode 100 comprising a plurality of nanowires 114, e.g., 2 to 10 nanowires, the EQE is expected to be higher than for single nanowire embodiments, such as up to about 90%. Photodiodes according to other exemplary embodiments of the photodiode described herein, which can also include one or more nanowires, are also expected to be able to provide EQE values in the range of about 10% to about 90%.

Figure 2:
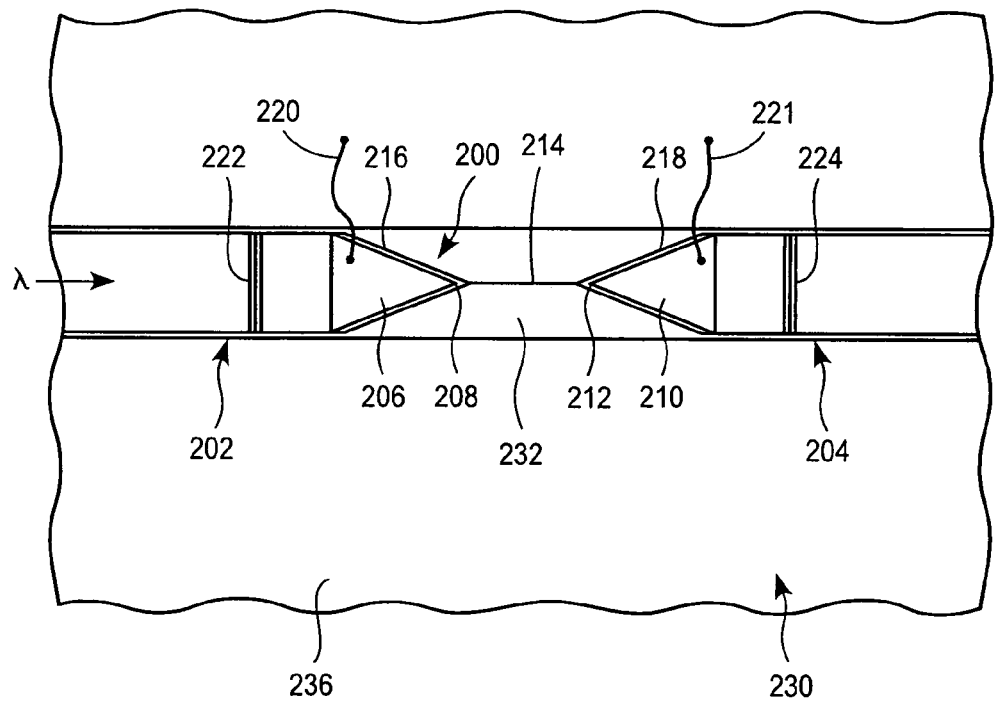
FIG. 2 illustrates a nanowire photodiode of FIG. 1 disposed on a substrate.

The exemplary embodiment of the photodiode 200 shown in FIG. 2 includes a first optical waveguide 202 and a second optical waveguide 204 disposed on a substrate 230. The photodiode 200 can have the same construction and be formed of the same materials as the photodiode 100, for example. In the embodiment, the first optical waveguide 202 includes a tapered first end 206 terminating in a first tip 208, and the second optical waveguide 204 includes a tapered second end 210 terminating in a second tip 212 spaced from the first tip 208. A nanowire 214 connects the first tip 208 to the second tip 212 in a bridging configuration. Embodiments of the photodiode 200 can comprise more than one nanowire 214, such as two, five, ten or more nanowires 214, depending on the desired capacitance of the device, and the desired EQE.

The substrate 230 can comprise any suitable material, such as silicon or compound semiconductor materials. For example, the substrate 230 can comprise a silicon wafer having a diameter of about 300 mm, or a group III-V semiconductor material, such as GaAs, having a diameter of about 75 mm to about 100 mm.

The substrate 230 comprises a groove 232 formed in the surface 236. The first optical waveguide 202 and second optical waveguide 204 are positioned in the groove 232. The groove 232 can have a depth such that the first optical waveguide 202 and second optical waveguide 204 extend partially above the surface 236. V-grooves can be used to contain silica optical fibers. The first optical waveguide 202 and second optical waveguide 204 can be metal bonded to the groove 232, or can be bonded by glass-to-silicon bonding, for example. Metal bonding can also be used for electrical contacts to the photodiode 200. The groove 232 can be formed in the surface 236 of the substrate 230 by laser ablation, photolithography and etching, or the like.

In an exemplary embodiment, the photodiode 200 is made by placing the first optical waveguide 202 and second optical waveguide 204 (following tapering) in the groove 232 with the first tip 208 spaced from the second tip 212 by a desired distance; forming coating layers 216, 218 on the first end 206 and second end 210, respectively (or alternatively doping the first end 206 and second end 210); and then growing the nanowire 214 to connect the first tip 208 to the second tip 212 in a bridging configuration.

In the embodiment, the first optical waveguide 202 and second optical waveguide 204 can be electrically connected to a power source via contacts and leads 220, 221, respectively, to produce reverse bias.

Figure 3:
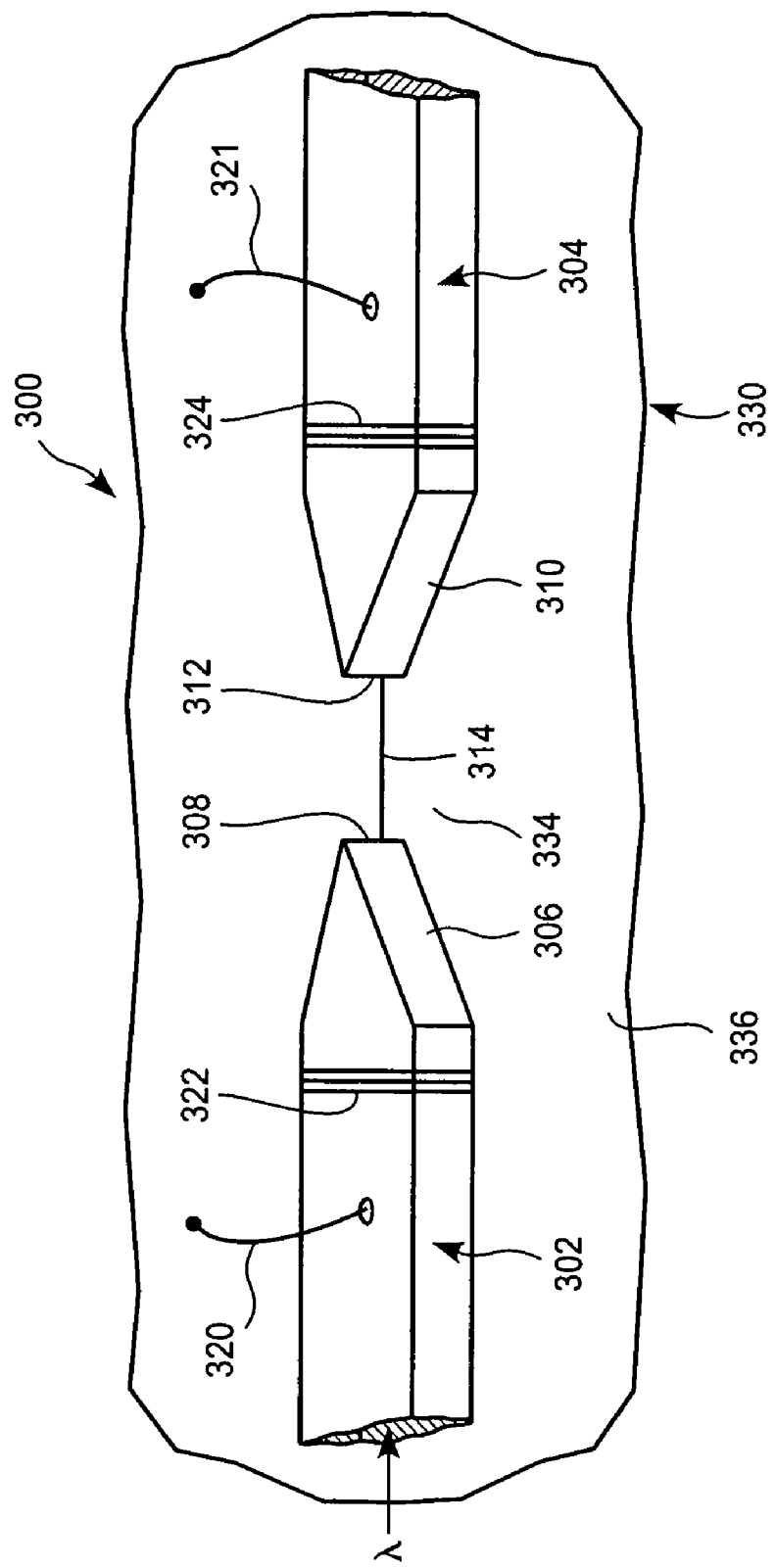
FIG. 3 illustrates another exemplary embodiment of a nanowire photodiode fabricated integrally on a substrate.

FIG. 3 depicts a photodiode 300 according to another exemplary embodiment. In this embodiment, a first optical waveguide 302 and a second optical waveguide 304 are formed integrally on the surface 336 of substrate 330, such that the first optical waveguide 302 and second optical waveguide 304 protrude above the surface 336. In the embodiment, the first optical waveguide 302 and second optical waveguide 304 are fabricated directly on the surface 336, and comprise the same semiconductor material as the surface 336.

In other embodiments of the photodiode 300, the optical waveguides can be formed in the surface 336 of the substrate as buried waveguides for planarization purposes.

As shown, the first optical waveguide 302 and second optical waveguide 304 can have a rectangular or square cross-section. In the illustrated embodiment, the first optical waveguide 302 includes a tapered first end 306 with a first tip 308, and the second optical waveguide 304 includes a tapered second end 310 with a second tip 312. A nanowire 314 connects the first tip 306 to the second tip 312 in a bridging configuration.

The first optical waveguide 302 and second optical waveguide 304 can be fabricated on the substrate 330 by photolithography techniques. The tapered portions can be produced by lithographic techniques, including photo- or nano-imprinting. Waveguides for near-IR transmission can typically have a width dimension of about 1 μm to about 10 μm, and a height of about 1 μm to about 10 μm, in the portions next to the tapered end 306 and tapered end 310, respectively. The waveguides can be tapered gradually with an angle of less than about 3°, such as less than about 2° or less than about 1°. Using nanoimprint lithography, for example, a tip having a dimension as small as about 10 nm or less can be formed on the tapered portions of the first optical waveguide 302 and second optical waveguide 304. The width of the first tip 308 of the first optical waveguide 302 and the width of the second tip 312 of the second optical waveguide 304 are preferably approximately equal to the diameter of the nanowire 314 to enhance light coupling efficiency. In the photodiode 300, the nanowire(s) 314 can typically have a diameter of about 10 nm to about 500 nm, and a length of about 0.5 μm to about 5 μm.

In the embodiment, the substrate 330 can be a crystalline or non-crystalline material. The substrate 330 can comprise, e.g., Si, Ge, a Si—Ge alloy, or a group III-V semiconductor material, such as GaAs or InP. The substrate 330, first optical waveguide 302 and second optical waveguide 304 can comprise a single piece of bulk semiconductor material. The bulk semiconductor material can be a single-crystal silicon wafer, for example, in or on which the photodiode 300 is fabricated.

The first optical waveguide 302 can comprise p-type or n-type semiconductor material and the second optical waveguide 304 can comprise the other of p-type or n-type semiconductor material. In another embodiment, at least a portion of the first end 306 of the first optical waveguide 302 can be coated or doped with p-type or n-type semiconductor material, and at least a portion of the second end 310 of the second optical waveguide 304 can be coated or doped with the other of p-type or n-type semiconductor material.

In the embodiment, an electrical insulator region 334 is formed in the substrate 330 to electrically isolate the p-type and n-type materials of the first optical waveguide 302 and second optical waveguide 304 to enable electrical current to flow through the nanowire 314 without having electrical shortage within the substrate 330. For example, the electrical insulator region 334 can be formed in the substrate 330 by ion implantation of insulator material in the substrate 330 between the first optical waveguide 302 and the second optical waveguide 304.

In the embodiment, the first optical waveguide 302 and second optical waveguide 304 are electrically connected to a power source via contacts and leads 320, 321, respectively. The power source is operable to produce reverse bias.

Additional optoelectronic and/or electronic elements can be fabricated on and/or in the substrate 330 to produce an integrated system. For example, light emitting devices, such as forward-biased nanowire lasers, can be fabricated using similar techniques and also provided on the substrate 330.

FIG. 4 depicts a photodiode 400 according to another exemplary embodiment. In this embodiment, at least the surface 436 of the substrate 430 comprises a dielectric material, such as $SiO_2$ or a nitride material, and the first optical waveguide 402 and second optical waveguide 404 are fabricated integrally on the dielectric material and protrude above the surface 436. The first optical waveguide 402 and second optical waveguide 404 can have the same configuration as the first optical waveguide 302 and second optical waveguide 304 of the photodiode 300, for example, as shown. The surface 436 of the substrate 430 can comprise $SiO_2$ grown on a silicon substrate (e.g., a (111) silicon wafer), for example. As shown, the first optical waveguide 402 and second optical waveguide 404 have an exemplary rectangular or square cross-section. The first optical waveguide 402 includes a tapered first end 406 with a first tip 408 and the second optical waveguide includes a tapered second end 410 with a second tip 412, respectively. A nanowire 414 connects the first tip 408 to the second tip 412 in a bridging configuration. In other embodiments, the waveguides can be formed in the surface 436 as buried waveguides.

The first optical waveguide 402 and second optical waveguide 404 can be fabricated on the substrate 430 by photolithography techniques used for dielectric materials. As described above, nanoimprint lithography can be used to form a tip having a width dimension as small as about 10 nm or less. The waveguides can be tapered gradually with an angle of less than about 3°, such as less than about 2° or less than about 1°. The first optical waveguide 402 and second optical waveguide 404 can have a width dimension of about 1 µm to about 10 µm, and a height of about 1 µm to about 10 µm in the portions next to the first end 406 and second end 410. The widths of the first tip 408 of the first optical waveguide 402 and the second tip 412 of the second optical waveguide 404 are preferably approximately equal to the diameter of the nanowire 414 to enhance the light coupling efficiency. In the photodiode 400, the nanowire(s) 414 can have a diameter of about 10 nm to about 500 nm, and a length of about 0.5 µm to about 5 µm, for example.

In the photodiode 400, the first optical waveguide 402 and second optical waveguide 404 are coated at selected locations with a semiconductor material to which the nanowire 414 is connected. For example, the first end 406 can have a coating 416 of p-type or n-type single crystal or non-single crystal semiconductor material, and the second end 410 can have a coating 418 of the other of p-type or n-type single crystal or non-single crystal semiconductor material. The coatings can cover the entire or only selected portions of the first end 406 and second end 410. The coatings 416, 418 formed on the first end 406 and second end 410, respectively, have selected doping levels that provide the desired electrical characteristics in the photodiode 400.

The coatings 416, 418 can be epitaxially grown on the first optical waveguide 402 and second optical waveguide 404 using any suitable techniques, such as MBE, MOCVD, CVD and PECVD.

In the embodiment, the first optical waveguide 402 and second optical waveguide 404 can be electrically connected to a power source via contacts and leads 420, 421, respectively, to produce reverse bias.

Additional optoelectronic and/or electronic elements can be fabricated on and/or in the substrate 430 to produce an integrated system. For example, light emitting devices, such as forward-biased nanowire lasers, can be fabricated using similar techniques and also provided on the substrate 430.

In another embodiment, photodiodes can be fabricated on surfaces of substrates comprising non-single crystal material (e.g., glass). For example, a layer of silica can be fabricated on glass using methods to produce silica planar waveguide layers having a spaced arrangement. The waveguides are processed to have suitable tapers. The silica waveguides can then be coated with suitable materials, such as amorphous or polycrystalline Si doped either p-type or n-type or with a silicide, and one or more nanowires can be grown between the tapered p-type and n-type portions or silicide tapers in a bridging configuration.

As shown in FIGS. 3 and 4, the photodiodes 300, 400 include an optional first Bragg reflector 322, 422 fabricated in the first optical waveguide 302, 402 and an optional second Bragg reflector 324, 424 fabricated in the second optical waveguide 304, 404. The first Bragg reflectors 322, 422 and second Bragg reflectors 324, 424 reflect photons that are not absorbed by the nanowires 314, 414 on the first pass of the photons through the nanowires 314, 414. In some embodiments, the first Bragg reflector 322, 422 and second Bragg reflector 324, 424 can comprise alternating Bragg reflector layers and air gaps. In other embodiments, the Bragg reflectors can comprise alternating layers of semiconductor materials having different indices of refraction from each other and/or from material of the respective first optical waveguide and second optical waveguide, into which the Bragg reflectors are integrated. Techniques for forming reflector layers of a Bragg reflector in a semiconductor structure are described in U.S. Patent Application Publication No. 2006/0098705, which is incorporated herein by reference in its entirety.

In the exemplary photodiodes 100, 200, 300, 400, the nanowires 114, 214, 314, 414 are grown in a horizontal bridging arrangement. However, in other embodiments, the nanowires 114, 214, 314 and/or 414 can be grown in other orientations depending on the relative positions of the first tip 108, 208, 308, 408 and second tip 112, 212, 312, 412. For example, the nanowires 114, 214, 314 and/or 414 can alternatively extend either upwardly or downwardly at an acute angle to the horizontal, with the first optical waveguide 102, 202, 302, 402 and second optical waveguide 104, 204, 304, 404 vertically spaced from each other, or the nanowires 114, 214, 314 and/or 414 can extend vertically in a bridging configuration. In the illustrated photodiodes 100, 200, 300, 400, the first tips 108, 208, 308, 408, the nanowires 114, 214, 314, 414 and the respective second tips 112, 212, 312, 412 are collinear. In other embodiments, the first tips 108, 208, 308, 408, second tips 112, 212, 312, 412 and nanowires 114, 214, 314, 414 can lie in a common horizontal plane with the first tips spaced laterally from the respective second tips.

In the illustrated photodiodes 100, 200, 300, 400, a single nanowire 114, 214, 314, 414 is shown for simplicity. As described above, the photodiodes can optionally include multiple nanowires to improve the external quantum efficiency of the photodiodes. Embodiments of the photodiodes 100, 200, 300 and 400 can include more than one nanowire for use in applications in which the resulting device capacitance is sufficiently low. For example, some embodiments of the photodiodes 100, 200, 300 and 400 can include a plurality of nanowires, such as two, five, ten or more nanowires 114, connecting the first tip 108, 208, 308, 408 of the first optical waveguide 102, 202, 302, 402 to the second tip 112, 212, 312, 412 of the second optical waveguide 104, 204, 304, 404 in a bridging configuration. The nanowires are connected in parallel in the photodiodes 100, 200, 300, 400. Accordingly, the total capacitance equals the number of nanowires times the capacitance of the individual nanowires (which can typically be approximately equal).

The nanowires 114, 214, 314 and/or 414 of the photodiodes 100, 200, 300 and/or 400 can be an "i" material (i.e., a material that is not intentionally doped or is intrinsic material). In such embodiments, a p-i-n junction is formed between the first ends 106, 206, 306, 406 and the respective second ends 110, 210, 310, 410 and the nanowires 114, 214, 314 and/or 414. In other embodiments, the nanowires 114, 214, 314 and/or 414 can optionally be doped at opposite ends with p-type and n-type dopants.

In other embodiments, the nanowires 114, 214, 314 and/or 414 can comprise at least one elemental semiconductor material or at least one compound semiconductor material. Exemplary semiconductor materials that can be used to form the nanowires include Si, Ge, Si—Ge alloys; compound semiconductor materials including at least one Group III-V semiconductor material, such as binary alloys, e.g., GaP, GaAs, InP, InN, InAs, AlAs, AlN, BN and boron arsenide BAs, or at least one higher Group III-V alloy, such as AlGaAs, InAsP, GaInAs, GaAlAs, GaPAs; at least one group II-VI semiconductor material, such as zinc oxide (ZnO) and indium oxide (InO), and combinations of these or other semiconductor materials.

The nanowires 114, 214, 314, 414 of the photodiodes 100, 200, 300, 400 can be formed using any suitable growth technique. Suitable methods of growing the nanowires are described, e.g., in U.S. Patent Application Publication No. 2006/0097389, which is incorporated herein by reference in its entirety. For example, the nanowires can be grown from single crystal or non-single crystal surfaces by CVD techniques. Nanobridge formation using catalyst growth techniques are described, e.g., by T. Kamins, *Beyond CMOS Electronics: Self-Assembled Nanostructures*, The Electrochemical Society *Interface*, Spring 2005; and M. Saif Islam, S. Sharma, T. I. Kamins and R. Stanley Williams, *Ultrahigh-Density Silicon Nanobridges Formed Between Two Vertical Silicon Surfaces, Nanotechnology* 15, L5-L8 (2004), each of which is incorporated herein by reference in its entirety. In these techniques, nanowires are grown by interaction of a depositing material with a catalyst nanoparticle formed on the surface from which the nanowires are grown. Nanoparticles can be formed directly on the growth surface, or the catalyst material can be deposited (e.g., by physical vapor deposition (PVD) or CVD) on the growth surface followed by annealing the catalyst material to form the nanoparticle catalyst. Metal catalyst nanoparticles can comprise, for example, Ti, Au, Fe, Co, Ga and alloys thereof. The metal can be selected based on the nanowire composition. The catalyst nanoparticles can be in the liquid or solid phase during nanowire growth.

Exemplary techniques for growing compound semiconductor materials are described by B. J. Ohlsson, M. T. Bjork, M. H. Magnusson, K. Deppert and L. Samuelson, *Size-, shape-, and position-controlled GaAs nano-whiskers*, Appl. Phys. Lett., vol. 79, no. 20, pp. 3335-3337 (2001) (growth of GaAs nano-whiskers on GaAs substrates by metal-catalyzed growth techniques); M. H. Huang, S. Mao, H. Feick, H. Yan, Y. Wu, H. Kind, E. Weber, R. Russo and P. Yang, *Room-Temperature Ultraviolet Nanowire Nanolasers*, Science, vol. 292, pp. 1897-1899 (2001) (growth of ZnO nanowires on sapphire substrates); S. S. Yi, G. Girolami, J. Adamo, M. Saif Islam, S. Sharma, T. I. Kamins and I. Kimukin, *InP nanobridges epitaxially formed between two vertical Si surfaces by metal-catalyzed chemical vapor deposition*, Appl. Phys. Lett., vol. 89, 133121 (2006) (epitaxial growth of InP nanowires on silicon surfaces); and Haoquan Yan, Rongrui He, Justin Johnson, Matthew Law, Richard J. Saykally and Peidong Yang, *Dendritic Nanowire Ultraviolet Laser Array*, J. Am. Chem. Soc., vol. 125, no. 16, 4729 (2003) (fabrication of dendritic nanowire arrays of ZnO), each of which is incorporated herein by reference in its entirety.

Exemplary embodiments of the photodiodes 100, 200, 300, 400 can comprise nanowires 114, 214, 314, 414 including at least one controlled boundary at a given location along the nanowires formed during growth to control electronic properties of the nanowire. The nanowires can include a p-region and an n-region defining a p-n junction along the nanowires to assist in forming a strong built-in field in the nanowires. For example, the nanowires 114, 214, 314 and/or 414 can include a p-region adjacent the p-doped or p-type material-coated first tip 108, 208, 308, 408 of the first optical waveguide 102, 202, 302, 402, and an n-region adjacent the n-doped or n-type material-coated second tip 112, 212, 312, 412 of the second optical waveguide 104, 204, 304, 404.

Nanowire heterostructures can be formed by sequentially depositing different semiconductor materials along the nanowires. Heteroepitaxial layers having different compositions can be formed between p-regions and n-regions of the nanowires. See, e.g., M. T. Bjork, B. J. Ohisson, T. Sass, A. I. Persson, C. Thelander, M. H. Magnusson, K. Deppert, L. R. Wallenberg and L. Samuelson, *One-dimensional Steeplechase for Electrons Realized*, Nano Lett., vol. 2, no. 2, pp. 87-89 (2002) (forming InAs whiskers containing segments of InP), which is incorporated herein by reference in its entirety.

Embodiments of the above-described photodiodes can be constructed to detect optical signals in various applications, such as consumer electronics, optical communications, computing, chemical and biological analysis, and light radiation calibration and monitoring. Embodiments of the photodiodes can be incorporated in integrated systems including other nano-scale components.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

The invention claimed is:

1. A nanowire photodiode, comprising:
a first optical waveguide comprising a tapered first end including a first tip;
a second optical waveguide comprising a tapered second end including a second tip spaced from the first tip; and
at least one nanowire comprising at least one semiconductor material, the nanowire connecting the first tip and the second tip in a bridging configuration.

2. The nanowire photodiode of claim 1, wherein:
the nanowire has a length of about 0.5 μm to about 5 μm and a diameter of about 10 nm to about 500 nm; and
the first tip and the second tip have a width or diameter which is approximately equal to the diameter of the nanowire.

3. The nanowire photodiode of claim 1, wherein the first tip comprises p-type or n-type semiconductor material and the second tip comprises the other of p-type or n-type semiconductor material.

4. The nanowire photodiode of claim 3, wherein the p-type and n-type semiconductor materials are polycrystalline silicon, amorphous silicon, microcrystalline silicon, diamond or diamond-like carbon.

5. The nanowire photodiode of claim 1, wherein the nanowire comprises at least one group III-V compound semiconductor material.

6. The nanowire photodiode of claim 1, wherein:
the first optical waveguide includes a first Bragg reflector;
the second optical waveguide includes a second Bragg reflector; and
the first and second Bragg reflectors define an optical cavity including the nanowire.

7. The nanowire photodiode of claim 1, wherein the nanowire photodiode has a capacitance of less than about 1 femtofarad and an external quantum efficiency of at least about 10%.

8. The nanowire photodiode of claim 1, wherein the tapered first end and the tapered second end have a taper of less than about 3°.

9. A nanowire photodiode, comprising:
a substrate having a surface;
a first optical waveguide fabricated integrally on or in the surface of the substrate, the first optical waveguide comprising a tapered first end including a first tip;
a second optical waveguide fabricated integrally on or in the surface of the substrate, the second optical waveguide comprising a tapered second end including a second tip spaced from the first tip;
wherein the first and second optical waveguides comprise the same material as the surface of the substrate; and
at least one nanowire comprising at least one first semiconductor material, the nanowire connecting the first tip and the second tip in a bridging configuration.

10. The nanowire photodiode of claim 9, wherein:
the surface of the substrate and the first and second optical waveguides comprise a second semiconductor material;
the second semiconductor material is optionally a non-single crystal material;
the first and second optical waveguides are electrically isolated from each other on the substrate;
the first tip comprises p-type or n-type semiconductor material; and
the second tip comprises the other of p-type or n-type semiconductor material.

11. The nanowire photodiode of claim 9, wherein:
the surface of the substrate and the first and second optical waveguides comprise a dielectric material;
the first tip is coated with p-type or n-type semiconductor material; and
the second tip is coated with the other of p-type or n-type semiconductor material.

12. The nanowire photodiode of claim 9, wherein the nanowire photodiode has a capacitance of less than about 1 femtofarad and an external quantum efficiency of at least about 10%.

13. The nanowire photodiode of claim 9, wherein the tapered first end and the tapered second end have a taper of less than about 3°.

14. The nanowire photodiode of claim 9, wherein:
the first optical waveguide includes a first Bragg reflector;
the second optical waveguide includes a second Bragg reflector; and
the first and second Bragg reflectors define an optical cavity including the nanowire.

15. A method of fabricating a nanowire photodiode, comprising growing at least one nanowire comprising at least one first semiconductor material from a first tip of a tapered first end of a first optical waveguide such that the nanowire connects in a bridging configuration to a second tip of a tapered second end of a second optical waveguide spaced from the first tip.

16. The method of claim 15, wherein:
the nanowire has a length of about 0.5 μm to about 5 μm and a diameter of about 10 nm to about 500 nm; and
the first tip and the second tip have a width or diameter which is approximately equal to the diameter of the nanowire.

17. The method of claim 15, wherein:
the at least one first semiconductor material is at least one group III-V compound semiconductor material;
the first tip comprises p-type or n-type semiconductor material;
the second tip comprises the other of p-type or n-type semiconductor material;
wherein the p-type and n-type semiconductor materials are polycrystalline silicon, amorphous silicon, microcrystalline silicon, diamond or diamond-like carbon; and
the method further comprises:
forming a first Bragg reflector in the first optical waveguide; and
forming a second Bragg reflector in the second optical waveguide;
wherein the first and second Bragg reflectors define an optical cavity including the nanowire.

18. The method of claim 15, further comprising:
placing the first and second optical waveguides on a substrate;
doping or coating the first tip with p-type or n-type semiconductor material;
doping or coating the second tip with the other of p-type or n-type semiconductor material; and
growing the nanowire from the first tip to connect to the second tip.

19. The method of claim 15, further comprising:
etching a surface of a substrate to form the first optical waveguide on or in the surface;
etching the surface of the substrate to form the second optical waveguide on or in the surface;
doping or coating the first tip with p-type or n-type semiconductor material;

doping or coating the second tip with the other of p-type or n-type semiconductor material; and growing the nanowire from the first tip to connect in a bridging configuration to the second tip.

20. The method of claim 19, wherein:

a) the surface of the substrate and the first and second optical waveguides comprise a second semiconductor material; and the method further comprises forming an electrical isolation region in the substrate which electrically isolates the first and second optical waveguides from each other; or b) the surface of the substrate and the first and second optical waveguides comprise a dielectric material; and the method further comprises:

coating the first tip with p-type or n-type semiconductor material; and coating the second tip with the other of p-type or n-type semiconductor material.

\* \* \* \* \*

UNITED STATES PATENT AND TRADEMARK OFFICE
CERTIFICATE OF CORRECTION

PATENT NO. : 7,663,202 B2 Page 1 of 1
APPLICATION NO. : 11/819226
DATED : February 16, 2010
INVENTOR(S) : Shih-Yuan Wang et al.

It is certified that error appears in the above-identified patent and that said Letters Patent is hereby corrected as shown below:

In column 3, line 16, before "second" insert -- and --.

Signed and Sealed this

Twenty-seventh Day of July, 2010

David J. Kappos
*Director of the United States Patent and Trademark Office*